United States Patent [19]

Robertson

[11] Patent Number: 4,548,456
[45] Date of Patent: Oct. 22, 1985

[54] PRINTED CIRCUIT BOARD EDGE CONNECTORS

[75] Inventor: John A. Robertson, Dunfermline, Scotland

[73] Assignee: Burroughs Corporation, Detroit, Mich.

[21] Appl. No.: 451,905

[22] Filed: Dec. 21, 1982

[51] Int. Cl.$^4$ ............................................. H01R 13/62
[52] U.S. Cl. ......................... 339/75 MP; 339/176 MP
[58] Field of Search ............ 339/17 L, 75 M, 75 MP, 339/176 M, 176 MP

[56] References Cited

U.S. PATENT DOCUMENTS

3,594,699  7/1971  Jayne et al. ................... 339/75 MP
3,710,303  1/1973  Gallager, Jr. .................. 339/75 MP
4,127,317  11/1978  Tyree ............................ 339/176 MP Primary Examiner—Joseph H. McGlynn
Assistant Examiner—Paula A. Austin
Attorney, Agent, or Firm—Mark T. Starr; Kevin R. Peterson

[57] ABSTRACT

A system for providing edge connection to printed circuit boards and the like avoids prior art problems of insertion force and contact wear by employing a connector comprising two mutually-pivotable arms having protrusions at their distal ends which are separable in response to the insertion therebetween of a board to separate spring contact sections wherebetween the board can be passed without friction, the protrusions falling into a void in the board at the end of the insertion process to allow the spring contacts to impinge upon contact pads on the board, and the system operating in the reverse manner for the removal of a board.

10 Claims, 11 Drawing Figures

PRINTED CIRCUIT BOARD EDGE CONNECTORS

BACKGROUND OF THE INVENTION

1. The Field of the Invention

The present invention relates to connectors for providing a plurality of simultaneous electrical connections to a printed circuit board by the insertion therein of an edge of the printed circuit board.

2. The Prior Art

It is well known to employ an edge connector for providing a plurality of simultaneous electrical connections to a printed circuit board.

The edge of the board is provided with an array comprising a plurality of spaced contact pad areas. The areas are in general gold plated or plated with any other corrosion-resistant substance which is suitable for providing electrical connection. The connector comprises a correspondingly spaced array of spring contacts. The edge of the board is inserted into the connector to compress the spring contacts and bring each one of the contact pads into sliding engagement with a corresponding one of the spring contacts. The spring contacts are in general also plated with gold or any other corrosion resistant electrical conductor.

The spring contacts on the connector are generally arranged in opposed pairs such that one spring contact in each pair opposes the other through the thickness of the board. The pairs are regularly spaced along the length of the edge of the board. When the board is not therebetween the opposed members of each pair, being in a non-compressed condition, approach one another closely but do not touch. Even when non-compressed there is generally some residual force pushing each spring against stops in their housing such that it requires a definite starting force to initiate the separation of a pair.

In order to insert the board between the pairs it is necessary first to separate the pairs without damage thereto. To this end the board is generally provided with chamfers on its insertable edge. The contact pads reach right to the edge of the chamfers. By the time the spring contacts have been separated by the chamfers they are in contact with the leading edges of the pads and are also exerting maximum restoring force. High attritional wear therefore occurs where the pads meet the chamfers. Having been inserted to the ends of the chamfers, the board is further introduced between the pairs of spring contacts until each spring contact lies centrally on a corresponding one of the connector pads on the board. During this further introduction the pairs exert maximum restoring opposing forces against one another causing considerable and undesirable attritional wear as each spring contact slides against its pad. Plastic flow of the non-corroding electrically conducting layer can also occur.

The attrition of the surfaces of both the spring contacts and the pads causes the exposure to air of the underlying non-noble substrate which then becomes liable to atmospheric oxidation bringing about a degradation of the electrical conductivity of the spring contact to pad interface.

The plastic flow of the corrosion resistant layers renders their thickness less along the path of sliding contact between each spring contact and its corresponding pad. The layers are therefore subject to a greater susceptibilty to disappearance by attrition.

In the presence of possible oxidation the reliability of an edge connector decreases rapidly. When there are plural sets of contacts the chances of all sets simultaneously providing satisfactory operation is unacceptably small.

It has been one solution to the above problem to offset the effects of oxidation by arranging that the force between opposing pairs of spring contacts is very large indeed so that any oxide layer is broken up and the heat generated by friction causes small areas of air-excluding spring-to-pad welds. This approach causes the insertion force of a board into a connector to be extremely large and the withdrawal force to be correspondingly great. The rate of wear of the spring contacts and pads is enormous so that only a limited number of insertions and withdrawals is possible before a board and connector combination has to be discarded. The boards and connector housings must be unnecessarily mechanically strong to withstand the forces exerted thereon.

It has been another approach to provide that separate means is provided for lowering the spring contacts onto the board by the use of manually operable levers and the like. This approach relieves attritional wear but substitutes complexity and high cost, the connectors themselves taking up much space. Consequently, although successful, this approach is reserved for test equipment for testing boards.

It is therefore desirable to provide an edge connector of simple construction and small size for the insertion therein of a board for the establishing of electrical connection therebetween with substantially no sliding between spring contacts in the connector and contact pad areas on the board.

SUMMARY OF THE INVENTION

The present invention consists in a system for providing electrical connection to a printed circuit board, and system comprising a connector comprising first and second elastically opposed members respectively comprising first and second opposed protrusions and first and second opposed spring contacts, and said system further comprising a printed circuit board comprising an edge, first and second contact pads, and a void, where said edge is insertable between said protrusions to separate said spring contacts by separating said members, where said board is insertable a predetermined distance therebeyond without engaging said spring contacts for said protrusions to engage said void, and where, upon said protrusions engaging said void, said members are elastically restorable to their respective unseparated positions by said protrusions being urged into said void and said first and second spring contacts are urged to engage said first and second pad areas respectively.

BRIEF DESCRIPTION OF THE PREFERRED EMBODIMENT

In a first preferred embodiment first and second lever arms are rigid and pivoted at their ends remote from the direction of entry of a board into the connector. First and second spring contacts are preferably associated with the first and second lever arms respectively. The spring contacts preferably urge the lever arms together. The spring contacts preferably engage the lever arms by means of catches near to the end wherefrom a board enters the connector. The first and second lever arms preferably comprise first and second cutaways respectively to form a common void. The first and second lever arms preferably comprise first and second protrusions respectively at the end wherefrom a board is inserted into the connector and, when urged together, by the spring contacts, the protrusions preferably meet to press against one another. The first and second spring contacts preferably comprise first and second contact sections. The contact sections preferably protrude into the common void. When both the first and second lever arms are urged together by the spring contacts, the contact sections are preferably non-contiguously proximate to one another in the void. The first and second protrusions preferably comprise first and second entry ramps which co-operate to force the lever arms apart when the edge of the board is introduced thereto. The protrusions preferably comprise a bearing surface for pushing against one another and for pushing against a board. The first and second protrusions preferably comprise first and second exit ramps respectively for pushing the protrusions apart whenever a board which has been inserted into the connector is withdrawn therefrom.

In the first preferred embodiment the printed circuit board preferably comprises a leading edge. The leading edge is preferably unchamfered. A plurality of contact pads are preferably provided along the leading edge. The contact pads are preferably evenly spaced along the leading edge. Each end of the leading edge is preferably provided with a tab sharing an end portion of the leading edge. The tab preferably extends backwards from the leading edge for a distance a little less than the extent of the common void. Behind the tab there is preferably provided a gap large enough for the protrusions to touch one another therethrough.

The connector of the first preferred embodiment preferably comprises first and second members comprising respectively first and second contact-spacing bars. The contact-spacing bars preferably run the length of the connector. Each contact-spacing bar preferably comprises a lever arm at each end so that the entire connector comprises two opposed contact separating bars and four lever arms. The spring contacts preferably engage the rear of the contact-spacing bars. When the lever arms are separated the contact bars preferably move all of the spring contacts on their respective sides of the connector together.

In the operation of the first preferred embodiment the leading edge of the board is preferably introduced to the first and second entry ramps of the closed first and second lever arms respectively, and forced therebetween to push the first and second protrusions apart. The board is thereafter insertable therebeyond. In being pushed apart, the first and second lever arms preferably pull the first and second contact sections of the first and second spring contacts respectively far enough apart to avoid contact with a board as it is inserted into the connector. The board is preferably insertable until the leading edge engages the remote boundary of the common void. As the board engages the remote edge of the common void, the first and second protrusions preferably fall behind the tab into the gap preferably allowing the the first and second lever arms to come together and allowing the plurality of contact sections of the plurality of spring contacts on both sides of the board along the length of the contact-spacing bars to oppose one another on opposite sides of the board for each spring contact to connect with a corresponding contact pad.

In the first preferred embodiment the connector preferably comprises a common housing for the protection of the spring contacts. In a first preferred manner of mounting for the lever arms, the first lever arm is preferably affixed to the second lever arm by means of a pivot. The second lever arm is preferably a little longer than the first lever arm and is preferably affixed within the housing leaving only the second lever arm free to move within the housing. The housing is preferably U-shaped being open in the direction of insertion of a board.

In a second preferred manner of mounting for the lever arms both the first and second lever arms are provided with pegs which fit loosely into corresponding recesses in the housing and allow a degree of rotation of each lever arm relatively to the housing.

In a second preferred embodiment all things are as in the first preferred embodiment save that the lever arms, instead of being pivoted, are flexible and bend towards and away from one another without hinges or pivots. The protrusions are preferably provided at regular intervals along the length of the contact spacing bar. When said regular spacing necessitates the provision of a protrusion other than in the vicinity of a lever arm, that is, other than at the end of the leading edge of a board, the tab and gap is preferably replaced by a hole remote from the leading edge of the board by a distance equal to the width of a tab, the hole extending away from the leading edge by a distance sufficient to allow the coming together therethrough of a pair of protrusions.

In both the first and second preferred embodiments whenever an inserted board is to be withdrawn from the connector the rear of the tab or the edge of the hole in the board engages the exit ramps on the first and second lever arms forcing them apart with progressive withdrawal of the board and thereby disengaging the contact sections of the spring contacts from the pads on the board. Thereafter the board is preferably withdrawable from between the lever arms without any engagement with the spring contacts, the lever arms being closed behind the leading edge of the board as the leading edge of the board is removed from the entry ramps.

BRIEF DESCRIPTION OF THE DRAWINGS

The present invention is further explained, by way of an example, by the following description taken in conjunction with the appended drawings, in which.

DETAILED DESCRIPTION OF THE PREFERRED EMBODIMENTS

Figures 1, 4:
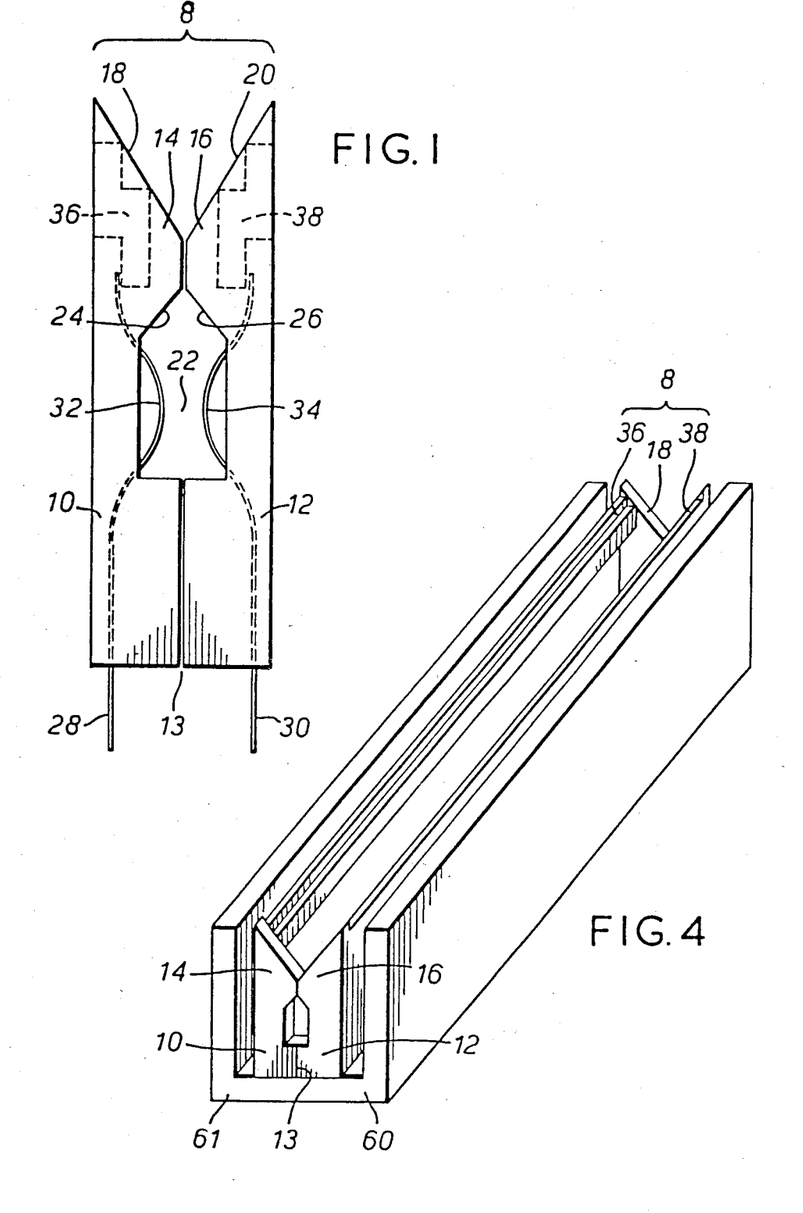
FIG. 1 shows a cross-sectional view of the active members of the connector of the first preferred embodiment.
FIG. 4 shows the connector of FIG. 1 in its housing.

FIG. 1 shows a cross sectional view of the active members of the connector of the first preferred embodiment.

The active assembly 8 comprises a first lever arm 10 and a second lever arm 12. The first and second lever arms 10, 12 are pivoted about their basal ends 13 in a manner to be described later so that they can swing apart from one another at their non-basal ends.

The first lever arm 10 comprises a first protrusion 14 extending towards the second lever arm 12. The second lever arm 12 comprises a second protrusion 16 extending towards the first lever arm 10. Both the first protrusion 14 and the second protrusion 16 are proximate to the non-basal ends of the first lever arm 10 and the second lever arm 12 respectively.

The first protrusion 14 has a first entry ramp 18 extending diagonally from the tip of the first lever arm 10 towards the second lever arm 12. The second protrusion 16 has a second entry ramp 20 extending from the tip of the second lever arm 12 towards the first lever arm 10 in a complementary manner to the first entry ramp 18 so that together they form a concave wedge symmetrical about the line of contiguity between the first and second lever arms 10, 12.

A common void 22 is formed by the provision of complementary cutaway sections in the first and second lever arms 10, 12 to the basal side of the first and second protrusions 14, 16 respectively.

The basal boundary of the first protrusion 14 with the common void 22 is provided in the form of a first exit ramp 24 which extends diagonally towards the second lever arm 12 in the general direction of its tip. The basal boundary of the second protrusion 16 with the common void 22 is provided in the form of a second exit ramp 26 which extends diagonally towards the first lever arm 10 in the general direction of its tip and which is complementary to the first exit ramp 24 such that together they form a concave wedge, when viewed from their basal ends, which is symmetrical about the line of contiguity between the first and second lever arms 10, 12.

A first spring contact 28 is provided in association with the first lever arm 10 and a second spring contact 30 is provided in association with the second lever arm 12. The first spring contact 28 as illustrated is in fact representative of a plurality of spring contacts stretching across the width of a connector in a manner which will be made clear in later description. The second spring contact 30 is similarly representative of a plurality of such contacts.

The first spring contact 28 comprises a first contact section 32 extending towards the second lever arm 12 in the area of the common void 22. The second spring contact 30 comprises a second contact section 34 extending towards the first lever arm 10 in the area of the common void. When the first and second lever arms 10, 12 are closed together the first and second protrusions 14, 16 meet, preventing closer approach of the first and second lever arms 10, 12, in which position the first and second contact sections 32, 34 fail to meet by a distance less than the thickness of a board.

The first lever arm 10 is provided with a first contact spacing bar 36. The first spacing bar 36 extends across the entire width of a connector in a manner which will become clear on reading later description. The first spring contact 28 engages the side of the first spacing bar 36 remote from the second lever arm 12 to urge the first lever arm 10 towards the second lever arm 12.

The second lever arm 12 is provided with a second contact spacing bar 38 which is extensive across the entire width of a connector in the same manner as the first contact spacing bar 36. The second spring contact 30 engages the side of the second contact spacing bar 38 remote from the first lever arm 10 to urge the second lever arm 12 towards the first lever arm 10.

It is to be appreciated that the engaging of the first contact spacing bar 36 by the first spring contact 28 is representative of such engagement by a plurality of similar spring contacts across the width of a connector and that the engaging of the second contact spacing bar 38 by the second spring contact 30 is representative of such engagement by a plurality of such spring contacts across the width of a connector.

Figure 2:
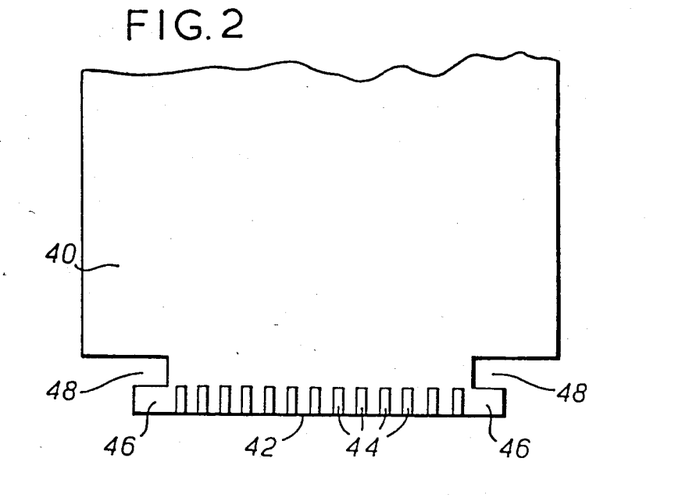
FIG. 2 shows a plan view of the printed circuit board of the first preferred embodiment.

FIG. 2 shows the board of the first preferred embodiment.

A printed circuit board 40 for the construction thereon of electrical or electronic circuits comprises a leading edge 42 for insertion into an electrical connector for the provision of electrical contacts to the board 40.

A plurality of contact pad areas 44 are provided adjacent to the leading edge 42. The areas 44 need not necessarily be contiguous with the leading edge 42. The areas 44 are arranged with regular spacing along the leading edge 42 and on both faces of the board 40.

At either end of the leading edge 42 the board 40 is provided with a tab 46. The tab 46 is rectangular and shares one of its edges with the leading edge 42. The tab 46 extends backwards from the leading edge 42 by a distance which would allow the tab 46 to rest within the common void 22 of FIG. 1.

To the rear of the tab 46 the board 40 is provided with a gap 48. The width and disposition of the gap 48 is such that, if the tab 46 is resting within the common void 22, the first and second protrusions 14, 16 are able to meet within the gap 48.

Figure 3A:
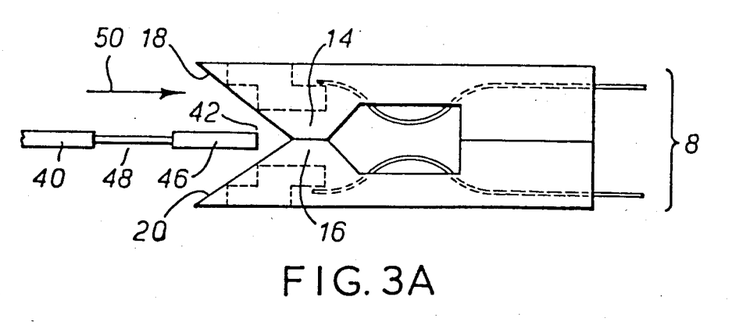
FIGS. 3A to 3C show three successive stages in the insertion of a board according to FIG. 2 into the connector according to FIG. 1.

FIG. 3A shows the first stage of the insertion of a board 40 into the active assembly 8 of FIG. 1.

The board 40 is inserted in the direction of the insertion arrow 50. The leading edge 42 of the board 40 engages the first and second entry ramps 18, 20 to separate the first and second protrusions 14, 16 which move apart to allow the entry of the tab 46 therebetween.

Figure 3B:
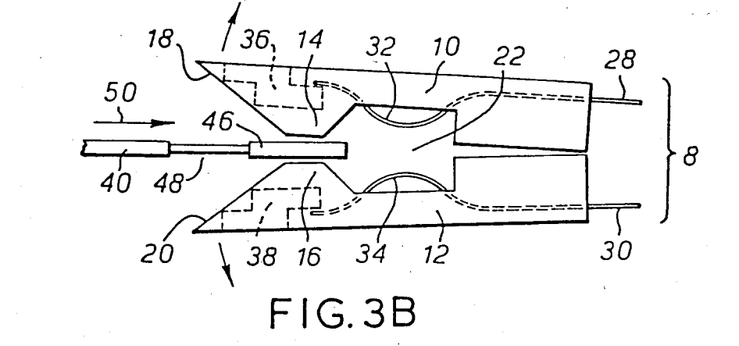

FIG. 3B shows the second stage of the insertion of a board 40 into the active assembly 8 of FIG. 1.

In forcing apart the first and second protrusions 14, 16 the entering board 40 also forces apart the first and second lever arms 10, 12 which carry with them the first and second contact sections 32, 34 respectively which are thereby separated by a distance greater than the thickness of a board 40 to allow the insertion of the tab 46 between the first and second protrusions 14, 16 into the common void 22 without abrasion between the contact sections 32, 34 and the pads 44.

Figure 3C:
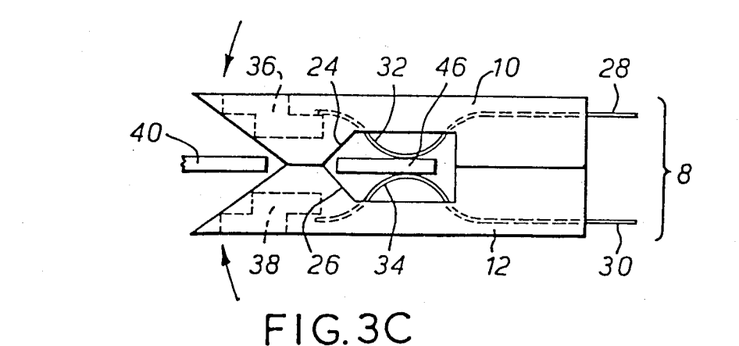

FIG. 3C shows the last stage in the insertion of a board 40 into the active assembly 8 of FIG. 1.

The tab 46 has passed entirely into the common void 22. The first and second protrusions 14, 16 have then been able to come together through the gap 48 allowing the restoration of the previous positions of the first and second lever arms 10, 12. The contact sections 32, 34 are thereby allowed to impinge upon the board 40 to engage the pads 44 without significant sliding therebetween.

When it is desired to remove the board 40 the first and second exit ramps 24, 26 behave towards the edge of the tab 46 remote from the leading edge of the board in the same way that the entry ramps 18, 20 behave towards the leading edge 42. The tab 46 causes the separation of the first and second protrusions 14, 16 and the consequent separation of the first and second lever arms 10, 12 and of the first and second spring sections 32, 34 to allow the removal of the board 40 without abrasion between the contact sections 32, 34 and the pads 44.

It is to be appreciated that by suitable choice of elastic constant for the spring contacts 28 30 and suitable choice of the pretension when the lever arms 10, 12 are open and choice of the separation of the contact sections 32, 34 when the lever arms 10, 12 are closed without a board 40 therebetween, the contact sections 32, 34 can be caused to exert any desired pressure on the pads 44.

It is also to be appreciated that, although the leading edge 42 of the board 40 is here shown as being unchamfered, there is nothing to prevent its being chamfered nor is there any reason why the edge of the tab 46 remote from the leading edge 42 should not be chamfered.

The tab 46 and the gap 48 are here shown as being substantially rectangular. It is to be appreciated that any other shape will suffice for them 46, 48 which allows for the mutual interaction of board 40 and active assembly 8 as described with relation to FIGS. 3A, 3B, and 3C.

The spring contacts 28, 30 and the pads 44 will in general be coated with an oxidation-resistant material such as a noble metal e.g. gold.

The entry ramps 18 20 and the exit ramps 24 26 are here shown as planar. It is to be appreciated that many other shapes will suffice for these surfaces, the only requirement placed thereon being that the pair of entry ramps 18 20 can co-operate to open the lever arms 10, 12 in response to the insertion of a board 40 and that the pair of exit ramps 24, 26 can co-operate to separate the lever arms 10, 12 in response to the withdrawal of a board 40. Whilst two pairs 18, 20 & 24, 26 are here shown with reflective symmetry about the line of contiguity between the lever arms 10, 12, those skilled in the art will readily appreciate that the invention will function without such symmetry with modifications which will be apparent.

The invention is here described showing two sets of spring contacts 28, 30. It is to be appreciated that an active assembly 8 comprising only one set of spring contacts 28 can be provided for making contact with pads 44 on just one side of a board 40, in which case there is a necessity for just one pivotable lever arm 10, the other lever arm 12 being replaceable by an inert bearing surface, the inert surface being provided with a protrusion 16 as an optional extra.

FIG. 4 shows the active assembly 8 of FIG. 1 in a protective housing.

The active assembly 8 is housed within a U-shaped protective housing 60. The active assembly 8 and the housing 60 together make up a connector. The housing 60 is in the form of a rectilinear, rectangular cross section, U-shaped trough with the basal end 13 of the active assembly 8 attached to the base section 61 of the trough and the protrusions, 14, 16 proximate to the open face of the trough such that a board 40 can be inserted through the open face of the trough into the active assembly 8 as described.

The active assembly 8 runs the entire length of the housing 60 by means of the contact spacing bars 36, 38 only one of which is clearly visible in FIG. 4. The spring contacts 28, 30 are regularly spaced along the contact spacing bars 36, 38 across the full width of the housing 60. A set of lever arms 10, 12 provided at either end of the contact spacing bars 36, 38 and the two sets of lever arms 10, 12 co-operate on the insertion of a board 40 in a manner which will be apparent to separate the contact spacing bars 36, 38 in the manner described.

Figures 5, 6:
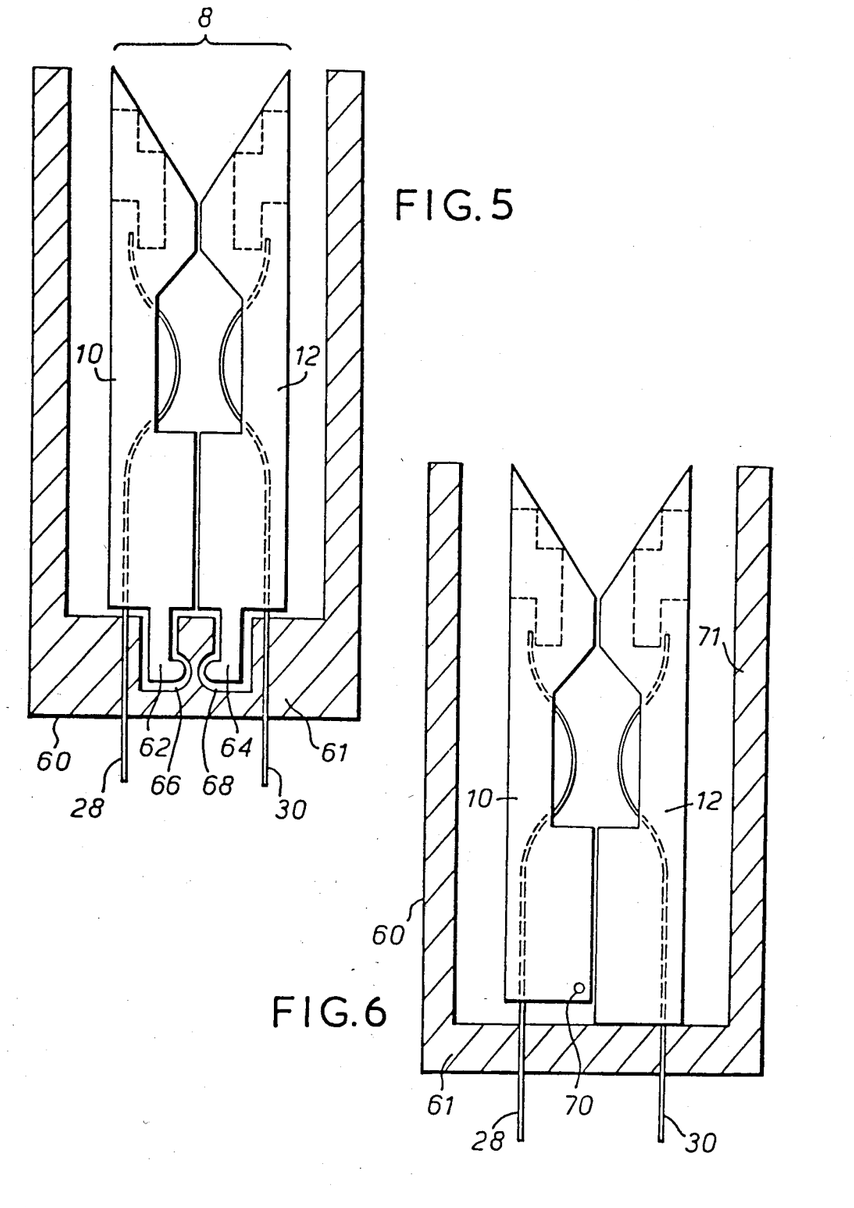
FIG. 5 shows a first manner of mounting the connector of FIG. 1 in its housing.
FIG. 6 shows a second manner of mounting the connector of FIG. 1 in its housing.

FIG. 5 shows a first manner of attaching the active assembly 8 in the housing 60.

The first and second lever arms 10, 12 are provided at their basal ends with first and second pegs 62, 64 respectively which provide a loose fit in first and second apertures 66, 68 in the base 61 of the housing 60. The pegs 62, 64 are so shaped that they are not free to disengage the base 61. Being of a loose fit, the pegs 62, 64 allow for the mutual pivoting between the first and second lever arms 10, 12 required for the present invention.

There is of course no reason why the pegs 62, 64 should not entirely through-penetrate the base 61 of the housing 60.

The spring contacts 28, 30 pass right through the housing 60 and can be soldered onto the exterior of the housing 60.

FIG. 6 shows a second manner of affixing the active assembly 8 within the housing 60.

The first lever arm 10 is attached to the second lever arm 12 by means of a pivot 70. The pivot 70 can range in complexity from a simple dimple-and-socket arrangement at either end of a pair of mouldings where a first moulding consists in a first lever arm 10 provided at either end of a first contact spacing bar 36 and a second moulding consists in a second lever arm 12 provided at either end of a second contact spacing bar 38, one moulding snap-fitting inside the other, to a full hinge stretching the entire length of a connector. The second lever arm 12 is slightly longer than the first lever arm 10 and is solidly and inflexibly affixed to the base 61 of the housing 60 to hold the first lever arm 10 a short distance clear of the base 61 for the first lever arm 10 to be free to pivot relative to the now unpivotable second lever arm 12. The second lever arm 12 can be affixed within the housing 60 in any suitable manner ranging from being an integral part of the housing 60 moulding by incorporation with the base 61 or one of its walls 71 to being pegged or glued into or onto the base 61. Once again the spring contacts 28, 30 through-penetrate the base 61 for soldering to external conductors outside the housing, it being appreciated that connecting means other than soldering are possible.

Those skilled in the art will appreciate that the manner of mounting shown in FIG. 6 can readily be adapted to do away with the housing 60 by the attachment of the basal end of the second lever arm 12 to any rigid support, the second lever arm 12 acting as the support for the first lever arm 10.

Figure 7:
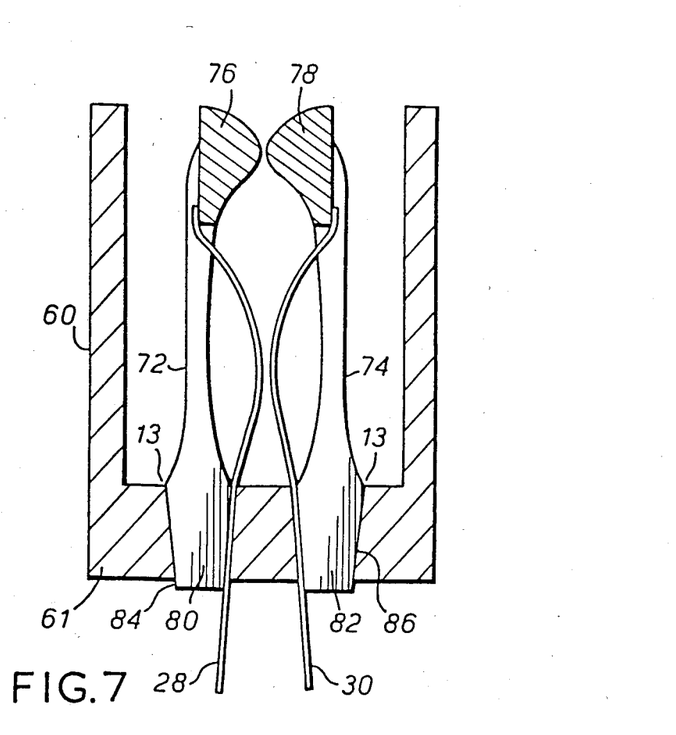
FIG. 7 shows a cross sectional view of the connector according to the second preferred embodiment.

FIG. 7 shows a cross sectional view of the active assembly of the second preferred embodiment of the present invention.

In the second preferred embodiment the first and second rigid lever arms 10, 12 of the first preferred embodiment are replaced by first and second flexible arms 72, 74. The flexible arms 72, 74 do not require the provision of any means for providing pivotal movement therebetween since the pivotal movement is automatically provided for by the mutual elastic deformability of the arms 72, 74. The spring contacts 28, 30 engage the outside faces of opposed bulbous protrusions 76, 78 on the non-basal ends of the first and second flexible arms 72, 74 respectively to provide some or all of the elastic restoring force tending to bring the arms 72, 74 back together. The basal ends 13 of the first and second flexible arms 72, 74 are provided with first and second pegs 80, 82 respectively which provide a firm push-fit into first and second peg holes 84, 86 in the base 61 of the housing 60. The spring contacts 28, 30 pass through the base 60 as for the first preferred embodiment.

Figure 8:
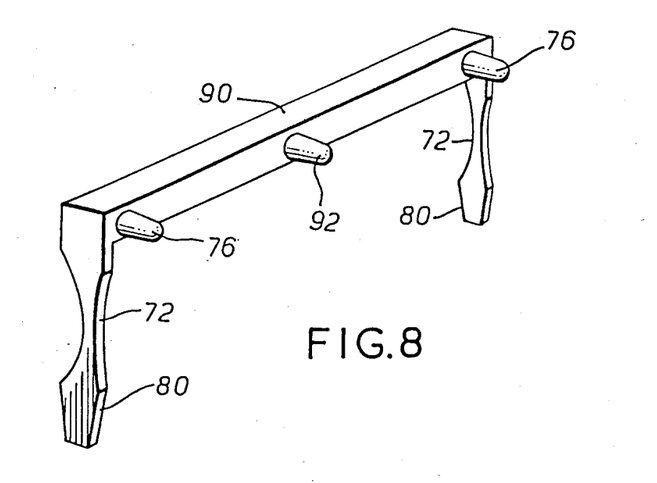
FIG. 8 shows the contact-spacing bar of the second preferred embodiment.

FIG. 8 shows one of the two contact spacing bars of the second preferred embodiment.

The contact spacing bar 90 is provided on either end with a flexible arm 72 just as the first contact spacing bar 36 of the first preferred embodiment is provided at either end with a lever arm 10, it being understood that in a complete connector according to the second preferred embodiment there is provided a second contact spacing bar provided at either end with a second flexible arm 74 just as the second contact spacing bar 38 of the first preferred embodiment is provided at either end with a second lever arm 12.

The bulbous protrusions 76 are provided at the ends of the spacing bar 90 in association with the flexible arms 72 at either end. In order to prevent flexing of the spacing bar 90 when a board 40 is inserted into a connector, one or more additional bulbous protrusions 92 are provided at regular or irregular intervals along the length of the spacing bar 90 to assist in the separation of the flexible arms 72, 74 and to distribute the load, it being understood that each additional bulbous protrusion 92 on the spacing bar 90 which is shown is opposed by a correspondingly-placed additional bulbous protrusion 92 on the other spacing bar which is not shown.

In use, the second preferred embodiment operates in the same manner as the first preferred embodiment, the surfaces of the bulbous protrusions 76, 78, 92 acting in the same manner as the ramps 18, 20, 24, 26 of the first preferred embodiment.

It is to be appreciated that whereas the pegs 80, 82 are shown as being through-penetrative of the base 61 of the housing 60 they might equally well extend through only a portion of the thickness of the base 61. It is also to be appreciated that the side walls of the housing 60 can be omitted to leave only the base 61. The flexible arms 72, 74 can be formed as part of a common moulding with the housing 60.

In that instance where the pegs 80 82 through-penetrate the base 61, it is possible to associate spring contacts 28, 30 with the very ends of the connector by jamming the contacts 28, 30 in the same peg holes 84, 86 as the pegs 80, 82.

Figure 9:
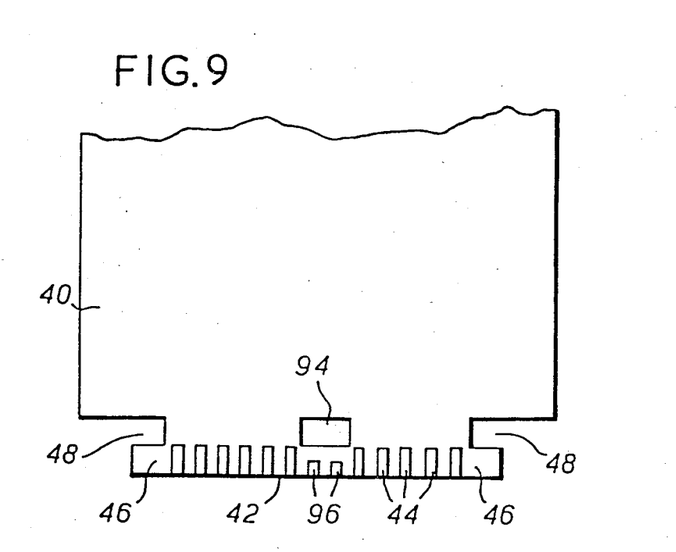
FIG. 9 shows the printed circuit board according to the second preferred embodiment.

FIG. 9 shows a printed circuit board 40 suitable for use in the second preferred embodiment of the present invention.

The board 40 is provided with tabs 46, gaps 48 and contacts 44 on both faces as before. In addition the board 40 is provided with one or more holes 94 which serve the same purpose for additional bulbous protrusions 92 as the gaps 48 serve for the bulbous protrusions 76, 78 at the ends of the spacing bar 90. The hole 94 is here shown as being rectangular but it is to be understood that many alternative shapes can be used. In addition to the hole 94, the board 40 is shown to have special pads 96 modified for use in the vicinity of additional bulbous protrusions 92, it being understood that the modified pads 96 can also be employed in the vicinity of the tabs 46 in those instances where spring contacts 28, 30 are provided in association with the actual flexible arms 72, 74 of the second preferred embodiment or the lever arms 10, 12 of the first preferred embodiment.

It is to be appreciated that, whereas the arms 72, 74, 10, 12 have, in both preferred embodiments, been shown and described as being situated at the extremities of the contact spacing bars 36, 38, 90, it is perfectly permissible to include them at any suitable position along the length of the spacing bars 36, 38, 90 and to have only one, or any number of them. It is to be appreciated that the tabs 46 and gaps 48 can be entirely replaced by suitable holes 94 even at the extremities of the leading edge 42.

Whereas the present invention has been described with reference to the use of a printed circuit board 40 having a substantially straight edge 42, it is to be appreciated that, with modifications which will be clear to those skilled in the art, the invention can be made to function with leading edges of varied and different shapes. It will also be apparent that the printed circuit board 40 can be replaced by numerous other electrical devices and one particular area of interest for the present invention is the provision of pluggable connections to very large scale integrated circuits up to the dimensions of a whole wafer.

The tabs 46 have so far been described as being of the same uniform thickness as the rest of the board 40. It is to be appreciated that the tabs 46 can be made with greater or lesser thickness than the board 40 to accomodate greater or lesser opening requirements for the arms 10, 12, 72, 74.

It is likely to be appreciated that whereas the gaps 48 and the hole 94 have been depicted as passing right through the board 40, the same function can equally be served by depressions that do not penetrate right through.

What I claim is:

1. A system wherein a connector provides electrical connection to an edge of a printed-circuit board, said connector comprising first and second opposed lever arms, means for pivotably coupling said first and second lever arms to each other, said first and second lever arms respectively including first and second opposed protrusions remote from said coupling means, and first and second opposed spring contacts respectively coupled to said first and second lever arms for urging said first and second lever arms towards each other, wherein said connector further includes a base, said second lever arm inflexibly affixed to said base, said pivotable coupling means connected between said second lever arm and said first lever arm, whereby said first lever arm may pivot about said second lever arm, and wherein said second lever arm is longer than said first lever arm and said first lever arm is pivotably coupled to said second lever arm so that the basal end of said first lever arm is a short distance clear of the base to allow the first lever arm to be free to pivot relative to the second lever arm; and said printed-circuit board comprising first and second contact pads on opposite sides thereof proximate to said edge and a void, where said edge is insertable between said opposed protrusions for the separation thereof to move said opposed lever arms and said opposed spring contacts apart, wherein said printed-circuit board is insertable a predetermined distance between said protrusions without said first and second spring contacts engaging said first and second pads, and wherein when said printed-circuit board is inserted said predetermined distance said protrusions engage said void in said printed-circuit board to allow the restoration of the unseparated positions of said opposed lever arms for said first and second spring contacts, in the coming-together thereof, to engage respectively said first and second contact pads.

2. A system according to claim 1 wherein said first and second lever arms are rigid.

3. A system according to claim 1 wherein said pivotable coupling means includes a pivot.

4. A system according to claim 1 wherein said base is through-penetrated by said first and second spring contacts.

5. A system according to claim 1 wherein said printed-circuit board comprises a tab, at one of the extreme ends of said edge, and wherein said void comprises the space behind said tab on the side of said tab remote from said edge.

6. A system according to claim 5 wherein said void is a hole in said printed-circuit board proximate to said edge.

7. A system according to claim 1 wherein said connector further includes third and fourth opposed lever arms pivotably coupled to each other, said third and fourth arms respectively including third and fourth opposed protrusions thereon, and wherein said printed-circuit board comprises a second void for engagement by said third and fourth protrusions, said connector further including a first contact-spacing bar intermediate between said first lever arm and said third lever arm and a second contact-spacing bar intermediate between said second lever arm and said fourth lever arm and a further plurality of pairs of opposed spring contacts engaging said first and second contact-spacing bars and operable with the coming together thereof to engage a further plurality of pairs of contact pads.

8. A system according to claim 7 wherein:

said printed-circuit board includes a first tab at one of the two extreme ends of said edge, said void comprising the space behind said first tab on the side of said first tab remote from said edge, and wherein said void is a first hole in said printed-circuit board proximate to said edge; and said printed-circuit board includes a second tab at the other of the two extreme ends of said edge, said second void comprising the space behind said second tab on the side of said second tab remote from said edge, and wherein said second void is a second hole in said printed-circuit board proximate to said edge.

9. A system according to claim 7 wherein said first and second protrusions respectively comprise first and second planar entry ramps for pushing said lever arms apart with the insertion thereagainst of said edge of said printed-circuit board for the insertion thereof into said connector.

10. A system according to claim 9 wherein said first and second protrusions respectively comprise first and second planar exit ramps for pushing said lever arms apart in response to the urging thereagainst of the edge of said void in said printed-circuit board for the withdrawal thereof from said connector.

* * * * *